United States Patent
Chen et al.

(10) Patent No.: US 12,057,524 B2
(45) Date of Patent: Aug. 6, 2024

(54) SEMICONDUCTOR STACK, SEMICONDUCTOR DEVICE AND METHOD FOR MANUFACTURING THE SAME

(71) Applicant: EPISTAR CORPORATION, Hsinchu (TW)

(72) Inventors: Meng-Yang Chen, Hsinchu (TW); Jung-Jen Li, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 16/728,769

(22) Filed: Dec. 27, 2019

(65) Prior Publication Data
US 2020/0212259 A1 Jul. 2, 2020

(30) Foreign Application Priority Data
Dec. 28, 2018 (TW) .................. 107147857

(51) Int. Cl.
*H01L 33/30* (2010.01)
*H01L 33/00* (2010.01)

(52) U.S. Cl.
CPC .......... *H01L 33/30* (2013.01); *H01L 33/0062* (2013.01); *H01L 2933/0033* (2013.01)

(58) Field of Classification Search
CPC .................. H01L 33/30; H01L 33/0062; H01L 2933/0033; H01L 33/305; H01L 33/02
See application file for complete search history.

(56) References Cited

U.S. PATENT DOCUMENTS

| | | | | |
|---|---|---|---|---|
| 5,585,648 A | * | 12/1996 | Tischler | H01L 33/007 257/E33.068 |
| 5,656,538 A | * | 8/1997 | Gardner | H01L 21/0262 117/88 |
| 5,740,192 A | * | 4/1998 | Hatano | H01S 5/32341 257/101 |

(Continued)

FOREIGN PATENT DOCUMENTS

| | | |
|---|---|---|
| CN | 1053146 A | 7/1991 |
| JP | H08148718 A | 6/1996 |

(Continued)

OTHER PUBLICATIONS

"Direct growth of high-quality InP layers on GaAs substrates by MOCVD," by K. F. Yarn et al., Active and Passive Elec. Comp., 2003, vol. 26(2), pp. 71-79.

(Continued)

*Primary Examiner* — Jarrett J Stark
(74) *Attorney, Agent, or Firm* — Juan Carlos A. Marquez; Marquez IP Law Office, PLLC

(57) ABSTRACT

The present disclosure provides a semiconductor stack, a semiconductor device and a method for manufacturing the same. The semiconductor device includes a first semiconductor layer and a light-emitting structure. The first semiconductor layer includes a first III-V semiconductor material, a first dopant, and a second dopant. The light-emitting structure is on the first semiconductor layer and includes an active structure. In the first semiconductor layer, a concentration of the second dopant is higher than a concentration of the first dopant. The first dopant is carbon, and the second dopant is hydrogen.

15 Claims, 5 Drawing Sheets

(56) References Cited

U.S. PATENT DOCUMENTS

| | | | |
|---|---|---|---|
| 5,932,896 A * | 8/1999 | Sugiura | B82Y 20/00 257/97 |
| 6,067,309 A * | 5/2000 | Onomura | H01S 5/0421 372/45.01 |
| 6,232,138 B1 * | 5/2001 | Fitzgerald | H01L 21/02546 257/190 |
| 6,697,412 B2 | 2/2004 | Beam et al. | |
| 9,608,103 B2 | 3/2017 | Ramer et al. | |
| 2001/0012678 A1 * | 8/2001 | Tanaka | H01L 21/0237 257/E21.112 |
| 2001/0042503 A1 | 11/2001 | Lo et al. | |
| 2003/0048822 A1 * | 3/2003 | Nakatsu | H01L 33/145 257/E33.068 |
| 2006/0049433 A1 * | 3/2006 | Hasegawa | B82Y 20/00 257/257 |
| 2008/0083919 A1 * | 4/2008 | Takahashi | H01L 33/025 257/13 |
| 2009/0022193 A1 * | 1/2009 | Hasegawa | H01S 5/04252 372/44.01 |
| 2009/0081110 A1 * | 3/2009 | Shibata | C30B 25/165 117/84 |
| 2009/0224269 A1 * | 9/2009 | Saeki | H01L 33/0093 257/94 |
| 2010/0133506 A1 * | 6/2010 | Nakanishi | H01L 33/14 257/14 |
| 2010/0260222 A1 * | 10/2010 | Jogan | H01L 21/02546 257/E29.089 |
| 2010/0301306 A1 * | 12/2010 | Albo | H01L 31/035218 257/13 |
| 2011/0012169 A1 * | 1/2011 | Takizawa | B82Y 20/00 257/103 |
| 2012/0032229 A1 * | 2/2012 | Deai | H01L 21/0245 257/190 |
| 2013/0032776 A1 * | 2/2013 | Chen | H01L 33/0095 438/39 |
| 2013/0234110 A1 * | 9/2013 | Kato | H01L 33/007 438/47 |
| 2013/0328106 A1 * | 12/2013 | Kokawa | H01L 21/02579 257/190 |
| 2014/0191261 A1 * | 7/2014 | Shatalov | H01L 33/30 257/94 |
| 2015/0243736 A1 * | 8/2015 | Kaneda | H01L 21/02579 438/478 |
| 2015/0255649 A1 * | 9/2015 | Kim | H01L 31/1804 257/190 |
| 2016/0268129 A1 * | 9/2016 | Mori | H01L 21/02645 |
| 2017/0098731 A1 * | 4/2017 | Shatalov | H01L 33/32 |
| 2017/0345642 A1 * | 11/2017 | Jorgenson | H01L 21/02576 |
| 2018/0090645 A1 * | 3/2018 | Nelson | H01L 33/42 |
| 2018/0287015 A1 | 10/2018 | Wang et al. | |
| 2019/0044010 A1 * | 2/2019 | Arikata | H01L 31/1844 |
| 2020/0052137 A1 * | 2/2020 | Maros | H01L 31/03042 |
| 2020/0212259 A1 * | 7/2020 | Chen | H01L 33/0062 |
| 2021/0005778 A1 * | 1/2021 | Huang | H01L 33/12 |

FOREIGN PATENT DOCUMENTS

| | | |
|---|---|---|
| JP | H11284222 A | 10/1999 |
| JP | 2010123803 | 6/2010 |
| JP | 2018116971 A | 7/2016 |
| TW | 201208117 A | 2/2012 |

OTHER PUBLICATIONS

"Two-step growth of InP on GaAs substrates by metalorganic vapor phase epitaxy," by Y. Takano et al., Journal of Crystal Growth 169 (1996), pp. 621-624.

Taiwan Office Action dated Jun. 24, 2022, in counterpart Taiwan application TW107147857.

* cited by examiner

SEMICONDUCTOR STACK, SEMICONDUCTOR DEVICE AND METHOD FOR MANUFACTURING THE SAME

CROSS REFERENCE TO RELATED APPLICATIONS

This application claims the right of priority based on TW Application Serial No. 107147857, filed on Dec. 28, 2018, and the content of which is hereby incorporated by reference in its entirety.

FIELD OF DISCLOSURE

The present disclosure relates to a semiconductor device, and particularly to a light-emitting device having a semiconductor stack.

BACKGROUND OF THE DISCLOSURE

With the rapid development of technology, semiconductor devices play a very important role in the areas of data transmission and energy conversion. The research and development of the related materials also continue to develop. For example, III-V compound semiconductor made of Group III and Group V elements can be used in a variety of photoelectric devices, such as light-emitting diodes (LEDs), laser diodes (LDs), solar cells, lighting, medicine, display, communications, sensing, and power systems. LED device is suitable for solid-state lighting sources and has the advantages of low power consumption and long life, so it has gradually replaced traditional light sources and widely used in traffic signs, backlight modules, and all kinds of lighting apparatuses and medical equipments.

SUMMARY OF THE DISCLOSURE

The present disclosure provides a semiconductor device including a first semiconductor layer and a light-emitting structure. The first semiconductor layer comprises a first III-V semiconductor material, a first dopant, and a second dopant. The light-emitting structure is disposed on the first semiconductor layer and comprises an active structure. In the first semiconductor layer, the doping concentration of the second dopant is greater than that of the first dopant. The first dopant is carbon and the second dopant is hydrogen.

The present disclosure further provides a method for manufacturing a semiconductor device. The method includes forming a first semiconductor layer wherein the first semiconductor layer comprises a first III-V semiconductor material, a first dopant, and a second dopant, and forming a light-emitting structure on the first semiconductor layer wherein the light-emitting structure comprises an active structure. In the first semiconductor layer, the doping concentration of the second dopant is greater than that of the first dopant. The first dopant is carbon and the second dopant is hydrogen.

The present disclosure further provides a semiconductor stack including a first semiconductor layer and a second semiconductor layer. The first semiconductor layer comprises a first III-V semiconductor material, a first dopant, and a second dopant. The second semiconductor layer is disposed on the first semiconductor layer and comprises a second III-V semiconductor material. In the first semiconductor layer, the doping concentration of the second dopant is greater than that of the first dopant. The first dopant is carbon and the second dopant is hydrogen. The full width at half maximum (FWHM) of the XRD spectrum tested on the first semiconductor layer is 300 arcsec or less.

DETAILED DESCRIPTION OF THE DISCLOSURE

Figure 1:
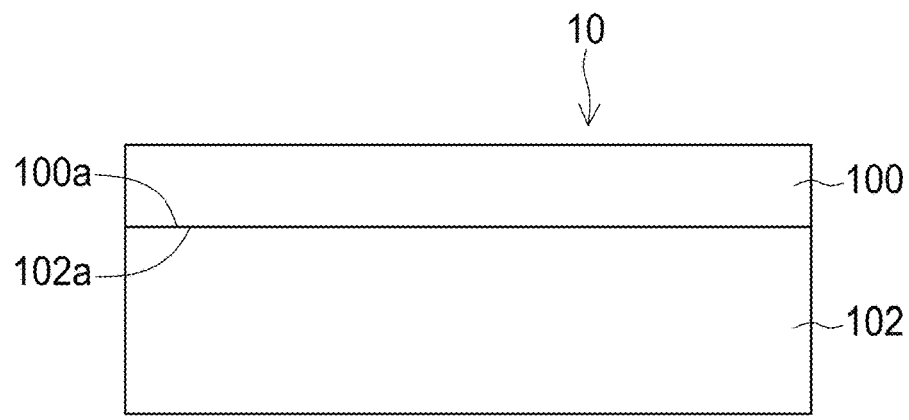
FIG. 1 shows a schematic view of a semiconductor stack in accordance with one embodiment of the present disclosure.

The following embodiments are described with accompanying drawings to disclose the concept of the present disclosure. In the drawings or description, the same or similar components are indicated with same numerals. Furthermore, the shape or the dimension of each component in the drawings are only for demonstration and is not intended to limit the invention scope. Particularly, it should be noted that components which are not illustrated or described in drawings or description can be in a form that is known by a person skilled in the art.

In the present disclosure, if not otherwise specified, the general formula InGaAsP represents $In_{x1}Ga_{1-x1}As_{1-y1}P_{y1}$, wherein $0 \leq x1 \leq 1$, and $0 \leq y1 \leq 1$; the general formula AlGaInAs represents $(Al_{y2}Ga_{(1-y2)})_{1-x2}In_{x2}P$, wherein $0 \leq x2 \leq 1$, and $0 \leq y2 \leq 1$; the general formula AlGaInP represents $(Al_{y3}Ga_{(1-y3)})_{1-x3}In_{x3}P$, wherein $0 \leq x3 \leq 1$, and $0 \leq y3 \leq 1$; the general formula InGaAs represents $In_{x4}Ga_{1-x4}As$, wherein $0 \leq x4 \leq 1$. In the semiconductor device of the present disclosure, the compositions, additives, and dopants included in each layer of the semiconductor device can be analyzed and determined by any suitable means such as SIMS (secondary ion mass spectrometer), and the thickness of each layer can be analyzed and determined by any suitable means, such as TEM (transmission electron microscopy) or SEM (scanning electron microscope). Moreover, the dopants described in the present disclosure can be doped by intentionally doping or unintentionally doping. The intentionally doping process, for example, can be in-situ doping process during epitaxial growth and/or implanting p-type or n-type impurity after epitaxial growth. The unintentionally doping, for example, is derived or induced by the manufacturing process.

People having ordinary skill in the art would understand easily the introduction of other components into the following embodiments. For example, the description of "forming a second layer on a first layer" indicates that the first layer directly contacts the second layer or other layers can be disposed between the first layer and the second layer such that the two layers do not directly contact with each other unless otherwise stated in the disclosure. In addition, the top-bottom relationship of the layers may vary as the structure or device operates or uses in different orientations. Furthermore, in the present disclosure, the description "substantially consist of X material" means that the main composition of the layer is X material, but does not exclude the inclusion of dopants or unavoidable impurities.

FIG. 1 shows a schematic view of a semiconductor stack 10 in accordance with one embodiment of the present disclosure. The semiconductor stack 10 includes a first semiconductor layer 100 and a second semiconductor layer 102. The second semiconductor layer 102 is connected to the first semiconductor layer 100. In the present embodiment, a surface 100a of the first semiconductor layer 100 directly contacts a surface 102a of the second semiconductor layer 102. No other structure (such as a buffer layer) is interposed between the first semiconductor layer 100 and the second semiconductor layer 102.

In the present embodiment, the first semiconductor layer 100 comprises a first III-V semiconductor material, such as a binary III-V semiconductor material. The first III-V semiconductor material is a material made of one or more group III elements and one or more group V elements in the periodic table of the chemical elements. The group III element can be gallium (Ga) or indium (In). The group V element can be arsenic (As) or phosphorus (P), and preferably does not contain nitrogen (N). Preferably, the first semiconductor layer 100 substantially consists of the first III-V semiconductor material, such as a binary III-V semiconductor material. In one embodiment, the first semiconductor layer 100 comprises InP. Preferably, the first semiconductor layer 100 substantially consists of InP. The first semiconductor layer 100 may include a dopant. In one embodiment, the first semiconductor layer 100 includes a first dopant and a second dopant. In the present embodiment, the doping concentration of the second dopant is greater than that of the first dopant in the first semiconductor layer 100. For example, the first dopant is carbon (C) and the second dopant is hydrogen (H). Thereby, the first semiconductor layer 100 has a surface having stable properties and fewer epitaxial defects that can serve various purposes, e.g., a surface which an epitaxial layer can be grown on. In one embodiment, the first semiconductor layer 100 may include a third dopant. For example, the third dopant is silicon (Si). In one embodiment, the dopants in the first semiconductor layer 100 may each have a doping concentration from about $1\times10^{16}$ cm$^{-3}$ to about $1\times10^{19}$ cm$^{-3}$, preferably from about $5\times10^{16}$ cm$^{-3}$ to about $5\times10^{17}$ cm$^{-3}$ or from $6\times10^{17}$ cm$^{-3}$ to $5\times10^{18}$ cm$^{-3}$. In one embodiment, the doping concentration of the third dopant in the first semiconductor layer 100 is less than $1\times10^{19}$ cm$^{-3}$, such as in the range of about $6\times10^{16}$ cm$^{-3}$ to about $1\times10^{17}$ cm$^{-3}$. When the dopant in the first semiconductor layer 100 has a suitable doping concentration, the first semiconductor layer 100 may have better electroconductive properties. In one embodiment, the conductivity-type of the first semiconductor layer 100 is n-type.

In the present embodiment, the second semiconductor layer 102 comprises a second III-V semiconductor material, such as a binary III-V semiconductor material. The second III-V semiconductor material is a material made of one or more group III elements and one or more group V elements in the periodic table of the chemical elements. The group III element can be gallium (Ga) or indium (In). The group V element can be arsenic (As) or phosphorus (P), and preferably does not contain nitrogen (N). The second III-V semiconductor material is different from the first III-V semiconductor material. In one embodiment, the constituent elements of the second III-V semiconductor material are all different from the constituent elements of the first III-V semiconductor material. Preferably, the second semiconductor layer 102 substantially consists of the second III-V semiconductor material, such as substantially consists of a binary III-V semiconductor material. In one embodiment, the second semiconductor layer 102 comprises GaAs. Preferably, the second semiconductor layer 102 substantially consists of GaAs. The second semiconductor layer 102 may include plural dopants. The plural dopants in the second semiconductor layer 102 may each have a doping concentration from about $5\times10^{15}$ cm$^{-3}$ to about $1\times10^{20}$ cm$^{-3}$, preferably from about $1\times10^{17}$ cm$^{-3}$ to about $1\times10^{18}$ cm$^{-3}$, from about $1\times10^{18}$ cm$^{-3}$ to about $1\times10^{19}$ cm$^{-3}$, or from $1\times10^{19}$ cm$^{-3}$ to $1\times10^{20}$ cm$^{-3}$. When the dopants in the second semiconductor layer 102 have suitable doping concentrations, the second semiconductor layer 102 may have better electroconductive properties. The dopants in the second semiconductor layer 102 may include silicon(Si), zinc (Zn), carbon(C), or hydrogen(H). In one embodiment, the conductivity-type of the second semiconductor layer 102 is n-type. In some embodiments, the first semiconductor layer 100 and the second semiconductor layer 102 have the same conductivity-type, for example, both are p-type or n-type. In one embodiment, the resistivity of the second semiconductor layer 102 is in the range of $10^7$ Ω-cm or more and $10^9$ Ω-cm or less, e.g., $10^8$ Ω-cm or more.

In some embodiments, the first semiconductor layer 100 and the second semiconductor layer 102 both contain a first dopant, a second dopant, and a third dopant. The doping concentration of the third dopant in the second semiconductor layer 102 is higher than the doping concentration of the third dopant in the first semiconductor layer 100. In some embodiments, the doping concentration of the second dopant in the second semiconductor layer 102 is higher than the doping concentration of the second dopant in the first semiconductor layer 100. In some embodiments, the doping concentration of the first dopant in the second semiconductor layer 102 is lower than the doping concentration of the first dopant in the first semiconductor layer 100. The first dopant is, e.g., carbon (C), the second dopant is, e.g., hydrogen (H), and the third dopant is, e.g., silicon (Si). By containing the specific dopants, the first semiconductor layer 100 and the second semiconductor layer 102 can obtain appropriate electroconductive properties and epitaxial qualities.

On the other hand, the first semiconductor layer 100 has a first lattice constant L1, and the second semiconductor layer 102 has a second lattice constant L2. In the present embodiment, the first lattice constant L1 is greater than the second lattice constant L2, and the difference ΔL % between the first lattice constant L1 and the second lattice constant L2 is in a range from 2% to 10%, preferably the lower limit of the range is 2.5% or 3%, or preferably the upper limit of the range is 5%. In detail, the difference between the first lattice constant L1 and the second lattice constant L2 can be calculated by the following formula: $\Delta L\% = (L1-L2)/L2 \times 100\%$. The above-mentioned lattice constants are measured by the X-ray diffraction pattern tested on the semiconductor material at a temperature of 300 K. The lattice constants of several semiconductor compounds are listed herein as a reference, as shown in Table 1 below.

TABLE 1

| | lattice constant (Å) |
|---|---|
| GaP | 5.45 |
| AlP | 5.45 |
| GaAs | 5.65 |
| InP | 5.87 |
| GaSb | 6.09 |

The first semiconductor layer 100 and the second semiconductor layer 102 can be manufactured by Liquid Phase Epitaxy (LPE), Molecular Beam Epitaxy (MBE), Chemical Beam Epitaxy (CBE), Metal Organic Chemical Vapor Deposition (MOCVD), or hydride vapor phase epitaxial (HVPE). In the present embodiment, the first semiconductor layer 100 is directly formed on the second semiconductor layer 102 which acts as a substrate. The thickness of the first semiconductor layer can be from 1 μm to 20 μm, preferably from 1 μm to 10 μm, and more preferably from 1 μm to 5 μm. In one embodiment, the thickness of the first semiconductor layer 100 is 2 μm. When the thickness of the first semiconductor layer 100 is within the above-mentioned range, the first semiconductor layer 100 can have better structural stability and the influence due to lattice mismatch can be further reduced. The thickness of the second semiconductor layer 102 can be in the range of about 50 μm to about 1000 μm, e.g., from about 100 μm to about 400 μm, or from about 150 μm to about 350 μm. Setting the thickness within the above-mentioned range allows the semiconductor structure to be subsequently grown to have a more stable structure. When the semiconductor stack 10, which includes the first semiconductor layer 100 and the second semiconductor layer 102, is observed by an electron microscope, the epitaxial defects on the surface of the first semiconductor layer 100 are small. In some embodiments, under X-ray diffraction (XRD) analysis, the FWHM of the XRD pattern tested on the first semiconductor layer 100 can be less than 500 arcsec, preferably, below 350 arcsec, more preferably below 300 arcsec, e.g., in the range of 100 arcsec to 200 arcsec. Thereby, the surface of the first semiconductor layer 100 is more suitable for the growth of epitaxial layers. Specifically, the first semiconductor layer 100 or the semiconductor stack 10 including the first semiconductor layer 100 and the second semiconductor layer 102 can be used as a growth substrate of a semiconductor device.

Figure 2A:
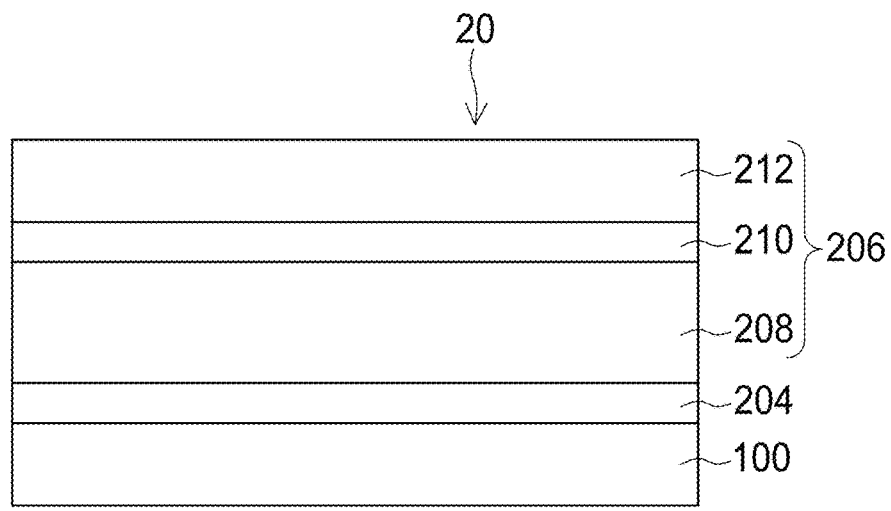
FIG. 2A shows a schematic view of a portion of a semiconductor device in accordance with one embodiment of the present disclosure.

FIG. 2A is a schematic view of a portion of a semiconductor device 20 in accordance with one embodiment of the present disclosure. In the present embodiment, the semiconductor device 20 includes a first semiconductor layer 100, a third semiconductor layer 204, and a light-emitting structure 206. The composition and other description of the first semiconductor layer 100 can be referred to the foregoing description of the first semiconductor layer 100, and are not described herein again. In addition, the third semiconductor layer 204 and the light-emitting structure 206 can be sequentially formed on the first semiconductor layer 100 by Liquid Phase Epitaxy (LPE), Molecular Beam Epitaxy (MBE), Chemical Beam Epitaxy (CBE), Metal Organic Chemical Vapor Deposition (MOCVD), or hydride vapor phase epitaxial (HVPE). In some embodiments, the first semiconductor layer 100, the third semiconductor layer 204, and the light-emitting structure 206 are sequentially formed on the second semiconductor layer 102 as described in the foregoing embodiment, and then the second semiconductor layer 102 is removed to form the structure as shown in FIG. 2A.

As shown in FIG. 2A, the third semiconductor layer 204 is located on the first semiconductor layer 100 and connected to the first semiconductor layer 100. In the present embodiment, there is no other structure (such as a buffer layer) between the first semiconductor layer 100 and the third semiconductor layer 204. The third semiconductor layer 204 comprises a third III-V semiconductor material, such as a binary III-V semiconductor material. The third III-V semiconductor material is a material made of one or more group III elements and one or more group V elements in the periodic table of the chemical elements. The group III element can be gallium (Ga) or indium (In). The group V element can be arsenic (As) or phosphorus (P), and preferably does not contain nitrogen (N). The third III-V semiconductor material is the same as the first III-V semiconductor material described above. Preferably, the third semiconductor layer 204 substantially consists of the third III-V semiconductor material, such as a binary III-V semiconductor material. In one embodiment, the third semiconductor layer 204 comprises InP. Preferably, the third semiconductor layer 204 substantially consists of InP. In addition, the third semiconductor layer 204 may include plural dopants. In some embodiments, the plural dopants in the third semiconductor layer 204 may each has a doping concentration from about $5\times10^{16}$ cm$^{-3}$ to about $5\times10^{18}$ cm$^{-3}$, preferably from about $5\times10^{17}$ cm$^{-3}$ to about $2\times10^{18}$ cm$^{-3}$ or from about $5\times10^{16}$ cm$^{-3}$ to about $5\times10^{17}$ cm$^{-3}$. In some embodiments, the first semiconductor layer 100 and the third semiconductor layer 204 both include a first dopant, a second dopant, and a third dopant. The first dopant is, e.g., carbon (C), the second dopant is, e.g., hydrogen (H), and the third dopant is, e.g., silicon (Si). In some embodiments, it is advantageous to further stabilize the epitaxial surface quality by forming the third semiconductor layer 204 on the first semiconductor layer 100. In some embodiments, the third semiconductor layer 204 can serve as a window layer to enhance the luminous efficiency of the semiconductor device 20, and the third semiconductor layer 204 is transparent to the light emitted by the light-emitting structure 206. In addition, in one embodiment, the conductivity-type of the third semiconductor layer 204 is n-type.

The light-emitting structure 206 includes an active structure 210, a fourth semiconductor layer 208, and a fifth semiconductor layer 212. The active structure 210 may comprise a single heterostructure (SH), a double heterostructure (DH), a double-side double heterostructure (DDH), or a multiple-quantum-wells (MQW) structure. When the semiconductor device 20 is in operation, the active structure 210 emits radiation. The radiation is preferably infrared light such as Near Infrared (NIR) light. In detail, when the radiation is near-infrared light, it may have a peak wavelength between 800 nm and 1700 nm, such as 810 nm, 840 nm, 910 nm, 940 nm, 1050 nm, 1070 nm, 1100 nm, 1200 nm, 1300 nm, 1400 nm, 1450 nm, 1550 nm, 1600 nm, 1650 nm, or 1700 nm. The active structure 110 may comprise a fourth III-V semiconductor material. The fourth III-V semiconductor material is a material made of one or more group III elements and one or more group V elements in the periodic table of the chemical elements. The group III element can be gallium (Ga) or indium (In). The group V element can be arsenic (As) or phosphorus (P), and preferably does not contain nitrogen (N). The fourth III-V semiconductor material can be a quaternary III-V semiconductor material. Preferably, the active structure 110 substantially consists of the fourth III-V semiconductor material. In one embodiment, the active structure 110 comprises a quaternary III-V semiconductor material, such as InGaAsP or AlGaInAs. Preferably, the active structure 110 substantially consists of a quaternary III-V semiconductor material, such as InGaAsP or AlGaInAs.

The fourth semiconductor layer 208 and the fifth semiconductor layer 212 are respectively located on two opposite sides of the active structure 210, and the fourth semiconductor layer 208 and the fifth semiconductor layer 212 may have opposite conductivity-types. For example, the fourth semiconductor layer 208 and the fifth semiconductor layer 212 may respectively include an n-type semiconductor and a p-type semiconductor so as to provide electrons and holes, respectively. Alternatively, the fourth semiconductor layer 208 and the fifth semiconductor layer 212 may respectively include p-type semiconductor and an n-type semiconductor so as to provide holes and electrons, respectively. The fourth semiconductor layer 208 and the third semiconductor layer 204 may have the same conductivity-type, for example, both are n-type semiconductor layers. Further, the fourth semiconductor layer 208 and the fifth semiconductor layer 212 respectively comprise a fifth III-V semiconductor material and a sixth III-V semiconductor material. The fifth III-V semiconductor material and the sixth III-V semiconductor material may each be a binary, ternary or quaternary III-V semiconductor material. The III-V semiconductor material is a material made of one or more group III elements and one or more group V elements in the periodic table of the chemical elements. The group III element can be gallium (Ga) or indium (In). The group V element can be arsenic (As) or phosphorus (P), and preferably does not contain nitrogen (N). In one embodiment, the fourth semiconductor layer 208 and the fifth semiconductor layer 212 each comprise a quaternary semiconductor material, such as InGaAsP, AlGaInP, or AlGaInAs. Preferably, the fourth semiconductor layer 208 and the fifth semiconductor layer 212 each substantially consist of a quaternary semiconductor material, such as InGaAsP, AlGaInP, or AlGaInAs.

The fourth semiconductor layer 208 and the fifth semiconductor layer 212 have different conductivity-types by adding different dopants. Specifically, the dopant includes magnesium (Mg), zinc (Zn), silicon (Si), tellurium (Te), etc., but is not limited thereto. In some embodiments, the doping process of the fourth semiconductor layer 208 and the fifth semiconductor layer 212 can be performed by in-situ doping during epitaxial growth and/or by implanting a p-type or n-type dopant after epitaxial growth. In one embodiment, the dopants in the fourth semiconductor layer 208 and the fifth semiconductor layer 212 may respectively have a doping concentration ranging from $2\times10^{17}$ cm$^{-3}$ to $1\times10^{20}$ cm$^{-3}$, preferably from $5\times10^{17}$ cm$^{-3}$ to $5\times10^{19}$ cm$^{-3}$.

Figure 2B:
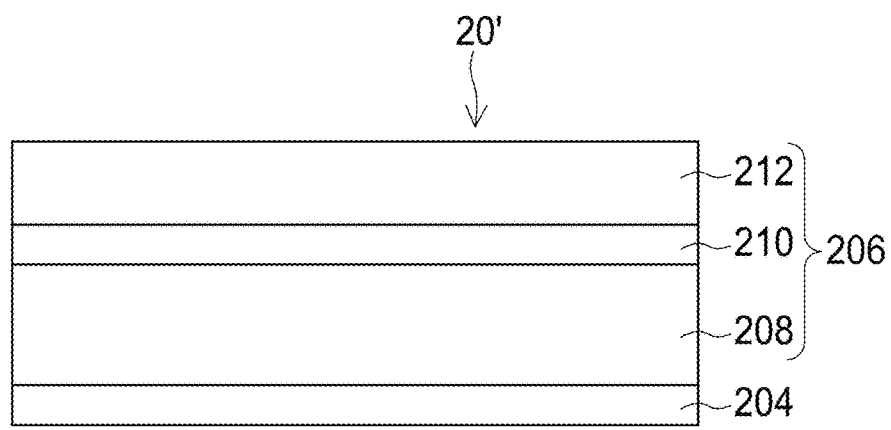
FIG. 2B shows a schematic view of a portion of a semiconductor device in accordance with one embodiment of the present disclosure.

In some embodiments, an etch stop layer can be further disposed between the first semiconductor layer 100 and the light-emitting structure 206. Referring to FIG. 2A, for example, the etch stop layer (not shown) can be disposed between the first semiconductor layer 100 and the third semiconductor layer 204. Next, the first semiconductor layer 100 can be removed depending on the requirements of the device structure, thereby forming a semiconductor device 20' as shown in FIG. 2B. By providing the etch stop layer, it is possible to avoid damaging the third semiconductor layer 204 and the light-emitting structure 206 when removing the first semiconductor layer 100. Next, the semiconductor device 20' may include a bonding layer (not shown) and is bonded to a supporting substrate through the bonding layer, and then, a subsequent process is performed. In one embodiment, the semiconductor device 20' includes only the structure as shown in FIG. 2B and does not contain the supporting substrate. In some embodiments, the etch stop layer comprises a seventh III-V semiconductor material. The seventh III-V semiconductor material can be a ternary or quaternary III-V semiconductor material. The III-V semiconductor material is a material made of one or more group III elements and one or more group V elements in the periodic table of the chemical elements. The group III element can be gallium (Ga) or indium (In). The group V element can be arsenic (As) or phosphorus (P), and preferably does not contain nitrogen (N). The etch stop layer preferably includes a group V element different from the group V element in the composition of the first semiconductor layer 100. In one embodiment, the etch stop layer comprises InGaAs. Preferably, the etch stop layer substantially consists of InGaAs.

Based on the above, since the first semiconductor layer 100 has a surface having a lower defect density, and is more suitable as a base layer for growing a semiconductor epitaxial layer. Specifically, when the third semiconductor layer 204 and other semiconductor layers are further formed on the first semiconductor layer 100, each of the semiconductor layers can still have good epitaxial quality.

Figure 3:
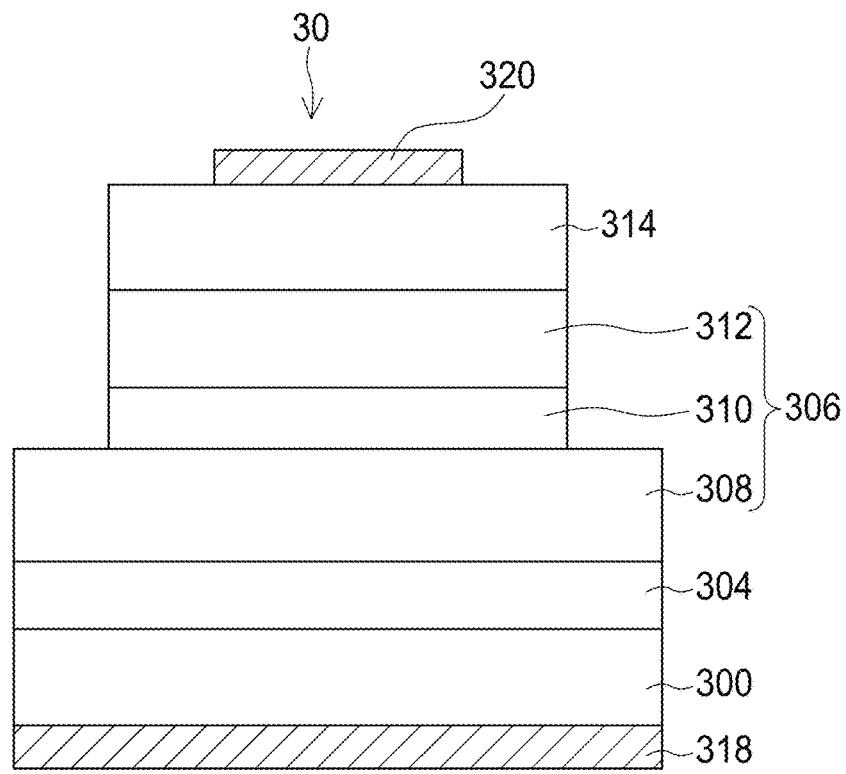
FIG. 3 shows a schematic view of a semiconductor device in accordance with one embodiment of the present disclosure.

FIG. 3 is a schematic view of a semiconductor device in accordance with one embodiment of the present disclosure. In the present embodiment, a semiconductor device 30 includes a first semiconductor layer 300, a third semiconductor layer 304, a light-emitting structure 306, a window layer 314, a first electrode 318, and a second electrode 320. The composition and other description of the first semiconductor layer 300, the third semiconductor layer 304, and the light-emitting structure 306 can be referred to the foregoing description of the first semiconductor layer 100, the third semiconductor layer 204, and the light-emitting structure 206, respectively, and are not described herein again. In detail, the composition and other description of the fourth semiconductor layer 308, the active structure 310, and the fifth semiconductor layer 312 in the light-emitting structure 306 can be referred to the foregoing description of the fourth semiconductor layer 208, the active structure 210, and the fifth semiconductor layer 212, respectively.

In the present embodiment, the window layer 314 is located on the light-emitting structure 306 and connected to the fifth semiconductor layer 312 in the light-emitting structure 306. In addition, the conductivity-type of the window layer 314 is opposite to the conductivity-type of the third semiconductor layer 304. For example, when the window layer 314 is a p-type semiconductor layer, the third semiconductor layer 304 is an n-type semiconductor layer. The window layer 314 may serve as a light extraction layer, thereby to further improve the luminous efficiency of the semiconductor device 30. In addition, the window layer 314 is transparent to the light emitted by the light-emitting structure 306.

The first electrode 318 and the second electrode 320 are electrically connected to an external power source, and the first electrode 318 and the second electrode 320 are electrically connected to the light-emitting structure 306. In the present embodiment, the first electrode 320 is connected to the window layer 314 and the second electrode 318 is connected to the first semiconductor layer 300, but are not limited thereto. Furthermore, the materials of the first electrode 318 and the second electrode 320 can be the same or different and include a transparent conductive material, a metal or an alloy. The transparent conductive material includes metal oxide such as indium tin oxide (ITO), indium oxide (InO), tin oxide (SnO), cadmium tin oxide (CTO), antimony tin oxide (ATO), aluminum zinc oxide (AZO), zinc tin oxide(ZTO), gallium zinc oxide (GZO), indium tungsten oxide (IWO), zinc oxide (ZnO) or indium zinc oxide (IZO). The metal can be gold (Au), platinum (Pt), titanium (Ti), aluminum (Al), copper (Cu) or nickel (Ni). The alloy can be GeAuNi, BeAu, GeAu, or ZnAu.

Figure 4:
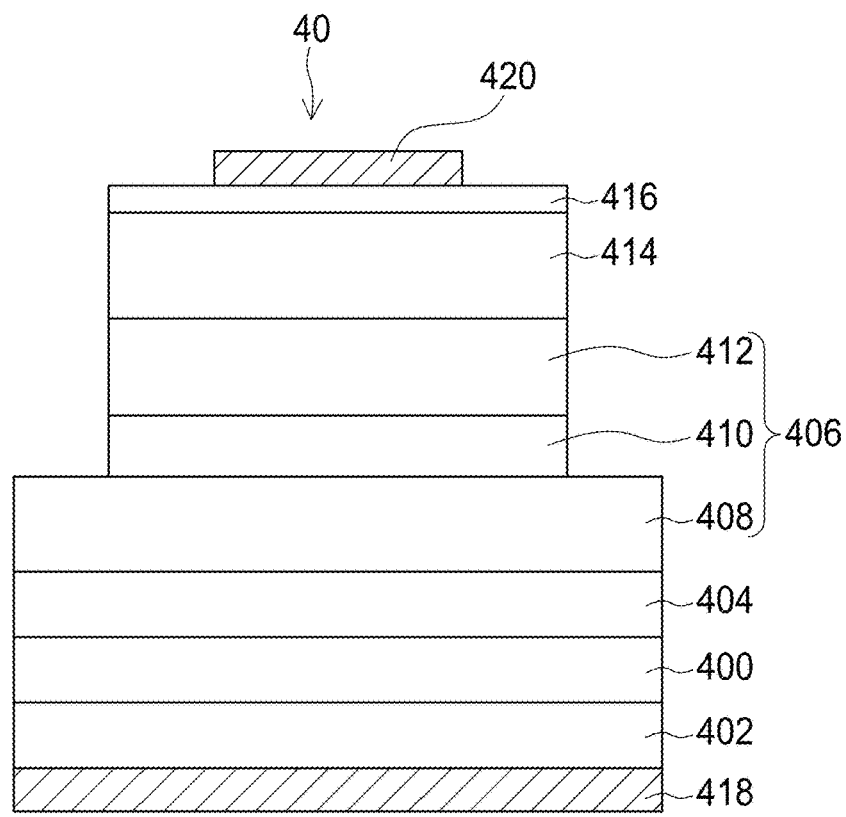
FIG. 4 shows a schematic view of a semiconductor device in accordance with one embodiment of the present disclosure.

FIG. 4 is a schematic view of a semiconductor device in accordance with one embodiment of the present disclosure. In the present embodiment, a semiconductor device 40 includes a first semiconductor layer 400, a second semiconductor layer 402, a third semiconductor layer 404, a light-emitting structure 406, a window layer 414, a contact layer 416, a first electrode 420, and a second electrode 418. The semiconductor device 40 differs from the aforementioned semiconductor device 30 mainly in that the semiconductor device 40 further includes the second semiconductor layer 402 and the contact layer 416. The composition and other description of the first semiconductor layer 400, the second semiconductor layer 402, the third semiconductor layer 404, the light-emitting structure 406, the window layer 414, the first electrode 420, and the second electrode 418 can be referred to the description of the foregoing embodiment, and are not described herein again. In detail, the composition and other description of the fourth semiconductor layer 408, the active structure 410, and the fifth semiconductor layer 412 in the light-emitting structure 406 can be referred to the foregoing description of the fourth semiconductor layer 208, the active structure 210, and the fifth semiconductor layer 212, respectively.

The contact layer 416 is located between first electrode 420 and window layer 414 for conducting current. The contact layer 416 may have the same conductivity-type as the window layer 414, e.g., a p-type semiconductor layer. In the present embodiment, the contact layer 416 is connected to the first electrode 420. In detail, the contact layer 416 is, e.g., a doped or undoped semiconductor layer, and may comprise an eighth III-V semiconductor material. The eighth III-V semiconductor material can be a binary or ternary III-V semiconductor material such as GaAs or InGaAs. When the first electrode 420 includes a metal or an alloy, an ohmic contact can be formed between the first electrode 420 and the contact layer 416 to form a good electrical contact between the first electrode 420 and the light-emitting structure 406.

Figure 5A:
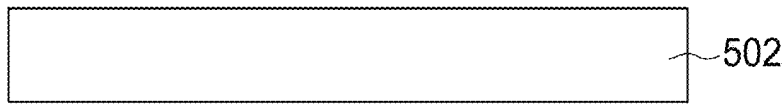
FIGS. 5A to 5D show schematic views of a manufacturing method of a semiconductor stack in accordance with one embodiment of the present disclosure.
Figure 5B:
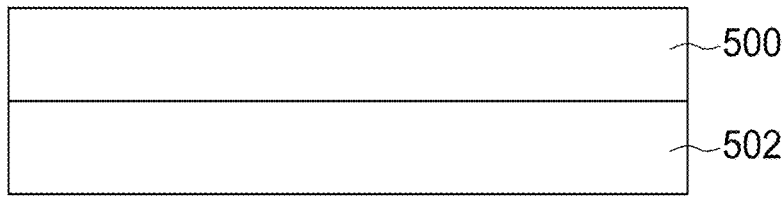
Figure 5C:
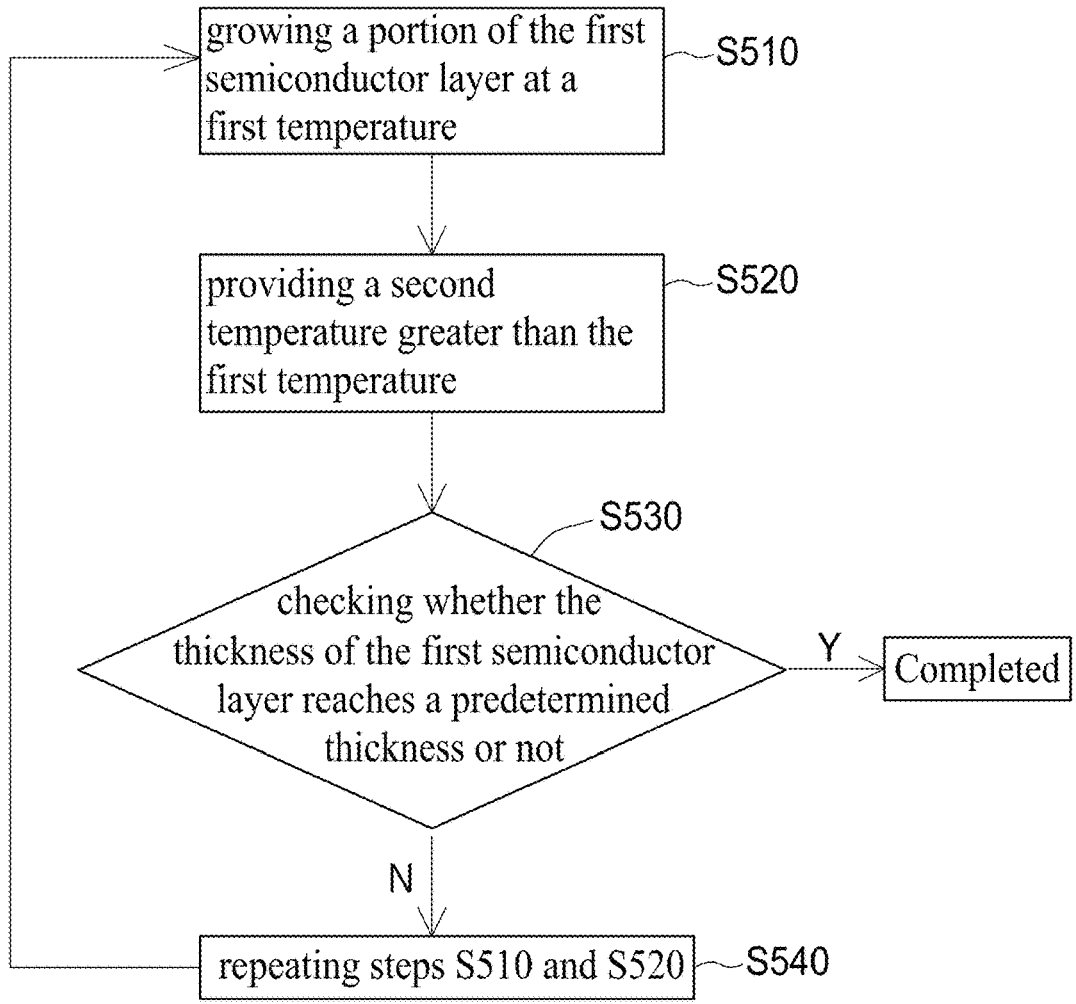

FIGS. 5A and 5B are cross-sectional views showing a method of fabricating a semiconductor stack in accordance with an embodiment of the present disclosure. FIG. 5C is a flow chart showing the fabrication of a semiconductor stack of one embodiment. The semiconductor stack can be a portion of a semiconductor device. As shown in FIGS. 5A and 5B, the second semiconductor layer 502 is first provided, and the first semiconductor layer 500 is formed on the second semiconductor layer 502. The related description of the first semiconductor layer 500 and the second semiconductor layer 502 can be referred to the description of the first semiconductor layer 100 and the second semiconductor layer 102 in the foregoing embodiments, and is not described herein again.

Referring to FIGS. 5A to 5C, step S510 is performed to grow a portion of the first semiconductor layer 500 at a first temperature. The growth of the first semiconductor layer 500 is achieved by, e.g., Liquid Phase Epitaxy (LPE), Molecular Beam Epitaxy (MBE), Chemical Beam Epitaxy (CBE), Metal Organic Chemical Vapor Deposition (MOCVD), or hydride vapor phase epitaxial (HVPE). The first temperature is, e.g., lower than 650° C. and higher than 400° C., preferably not more than 520° C., and more preferably in the range of 450° C. to 510° C. or 420° C. to 500° C. By performing the growth of the first semiconductor layer 500 in the above temperature range, good epitaxial quality can be further obtained.

Next, step S520 is performed by providing a second temperature greater than the first temperature. The second temperature is, e.g., in the range of 700° C. or more and 850° C. or less, preferably more than 750° C., and more preferably 760° C. to 810° C. or 780° C. to 800° C. In step S520, for example, the ambient temperature for epitaxy growth is adjusted from the first temperature to the second temperature. In some embodiments, the difference between the first temperature and the second temperature is not less than 300° C., thereby, a better epitaxial result can be achieved. Further, the growth of the first semiconductor layer 500 may not be performed under the second temperature. In this step, the ambient temperature is raised to a higher temperature, i.e. the second temperature, for thermal annealing. The growth of the first semiconductor layer 500 is not performed at the second temperature in order to adjust the stress in the portion of the first semiconductor layer 500 that was previously grown at the first temperature and to reduce the epitaxial defects.

Then, step S530 is performed to check whether the thickness of the first semiconductor layer 500 reaches a predetermined thickness or not. When the first semiconductor layer 500 reaches the predetermined thickness, the fabrication of the first semiconductor layer 500 and the second semiconductor layer 502 is completed. In some embodiments, the predetermined thickness can be 20 Lm or less, preferably 10 Lm or less, more preferably 5 Lm or less, and 1 μm or more. When the first semiconductor layer 500 has not reached the predetermined thickness, the fabrication process proceeds to step S540 which repeats steps S510 and S520. For example, at least step S510 and step S520 are repeated more than twice. In some embodiments, step S510 and step S520 is repeated more than 10 times to obtain a semiconductor stack having an appropriate thickness and a relatively stable epitaxial quality. Further, step S510 and step S520 are repeated less than 30 times.

Based on the above, The problem of stress generated by the lattice mismatch between the first semiconductor layer 500 and the second semiconductor layer 502 can be resolved by the foregoing method of heating and cooling during the fabrication process of preparing the first semiconductor layer 500, and not necessary by introducing other buffer structures or processes to obtain a structure having good epitaxial quality.

In some embodiments, the stack of the first semiconductor layer 500 and the second semiconductor layer 502 can be used as a base layer, and subsequent growth of an epitaxial structure can be performed upon request. For example, a light-emitting structure can be directly formed on the stack of the first semiconductor layer 500 and the second semiconductor layer 502.

Figure 5D:
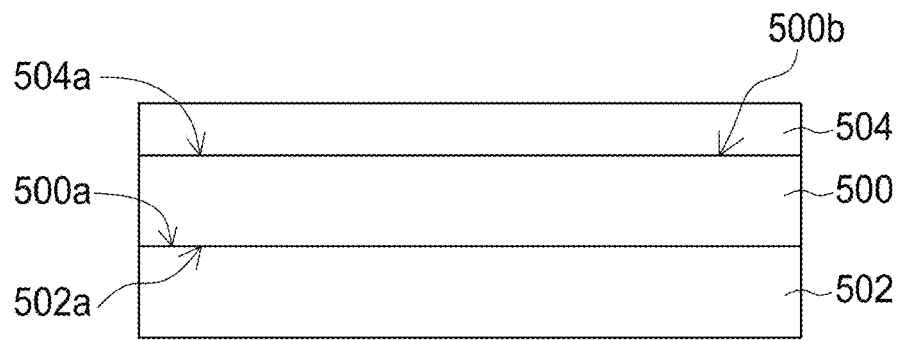

As shown in FIG. 5D, a third semiconductor layer 504 can be further formed on the stack of the first semiconductor layer 500 and the second semiconductor layer 502. The related description of the third semiconductor layer 504 can be referred to the description of the third semiconductor layer 204 in the foregoing embodiments, and is not described herein again. As described above, the light-emitting structure can be formed on the third semiconductor layer 504. One side of the first semiconductor layer 500 is connected to the second semiconductor layer 502, and the other side of the first semiconductor layer 500 is connected to the third semiconductor layer 504. A surface 500a of the first semiconductor layer 500 directly contacts a surface 502a of the second semiconductor layer 502, and the other surface 500b of the first semiconductor layer 500 directly contacts a surface 504a of the third semiconductor layer 504.

Figure 5E:
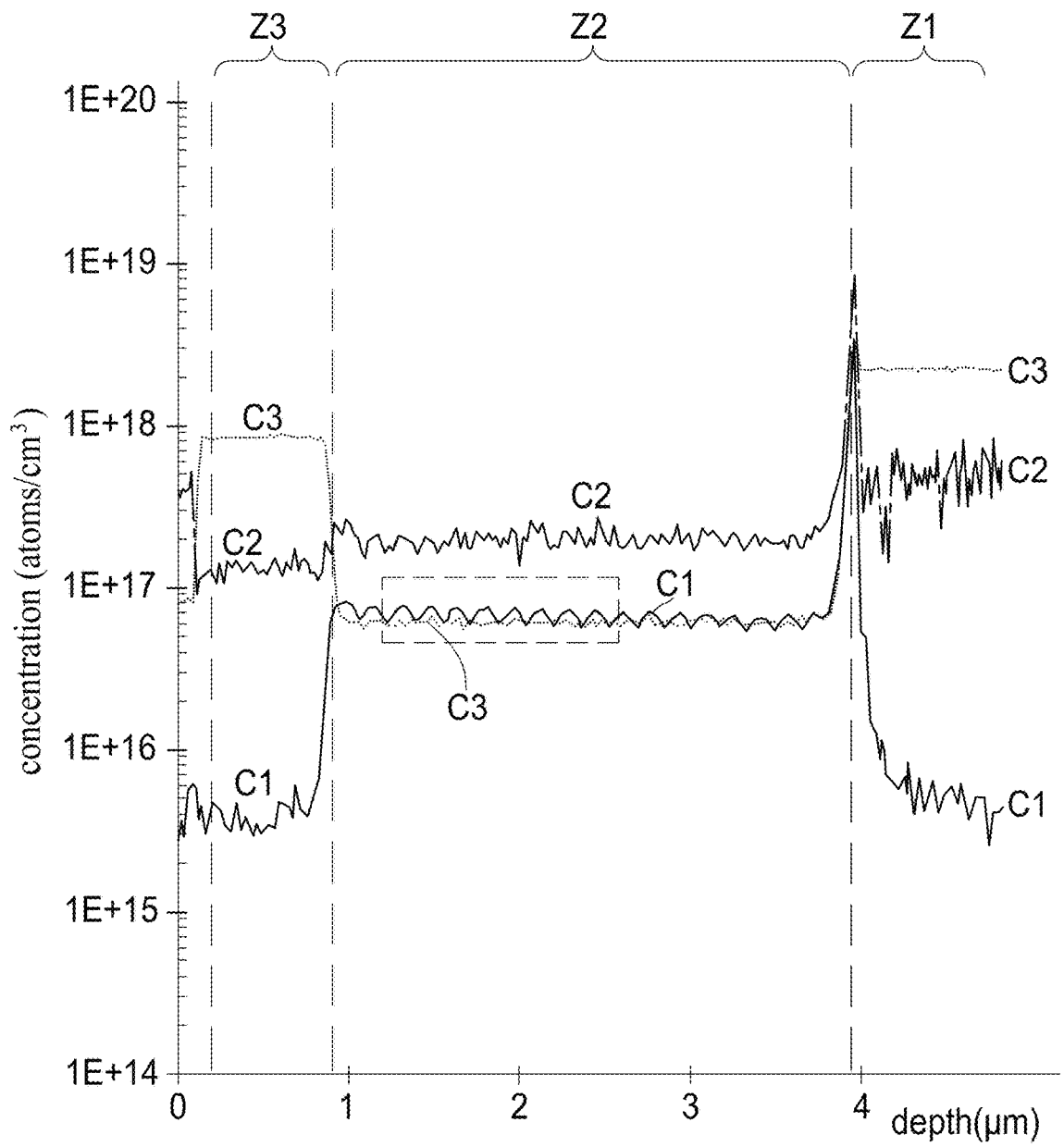
FIG. 5E is a graph showing the relationship between the element concentration and the depth of a partial region of a semiconductor device in accordance with one embodiment of the present disclosure.

FIG. 5E is a graph showing the relationship between the element concentration and the depth of a partial region of a semiconductor device in accordance with one embodiment of the present disclosure. Specifically, FIG. 5E is an analysis result of a partial region of the semiconductor device as shown in FIG. 5D analyzed by secondary ion mass spectrometry (SIMS). As shown in FIG. 5E, a first region Z1, a second region Z2, and a third region Z3 can be roughly classified according to the thickness and the sequence of the layers in the semiconductor device. Specifically, the first region Z1 corresponds to the second semiconductor layer 502, the second region Z2 corresponds to the first semiconductor layer 500, and the third region Z3 corresponds to the third semiconductor layer 504. In the present embodiment, the first semiconductor layer 500 and the third semiconductor layer 504 each include plural dopants and substantially consist of InP. The second semiconductor layer 502 includes plural dopants and substantially consists of GaAs. The dopants described above include at least a first dopant, a second dopant, and a third dopant. The first dopant is carbon (C) and is represented by C1, the second dopant is hydrogen (H) and is represented by C2, and the third dopant is silicon (Si) and is represented by C3. The concentrations of C1, C2, and C3 referred to the vertical axis on the left side of FIG. 5E represent the first, second, and third dopants, respectively. In the present embodiment, the first dopant and the second dopant are unintentionally doped, and the third dopant is intentionally doped.

The first semiconductor layer 500, which is a single-layer structure, is grown by the foregoing method such that both of the unintentionally doped first dopant and second dopant have a doping concentration greater than $10^{16}$ cm$^{-3}$ in the first semiconductor layer 500. And the curve of the carbon (C) concentration has a pattern similar to a periodic change. As shown in the second region Z2 of FIG. 5E, the concentration of the second dopant is higher than the concentration of the first dopant, that is, the hydrogen (H) concentration is greater than the carbon (C) concentration in the first semiconductor layer 500. Furthermore, the concentration of the third dopant in the second zone Z2 is lower than the concentration of the third dopant in the first zone Z1 and is also lower than the concentration of the third dopant in the third zone Z3. That is, the silicon (Si) concentration in the first semiconductor layer 500 is lower than the silicon (Si) concentration in the second semiconductor layer 502 or the third semiconductor layer 504. On the other hand, in the second region Z2, the concentration of the second dopant is higher than the concentration of the third dopant, that is, the hydrogen (H) concentration is greater than the silicon (Si) concentration in the first semiconductor layer 500.

Figure 5F:
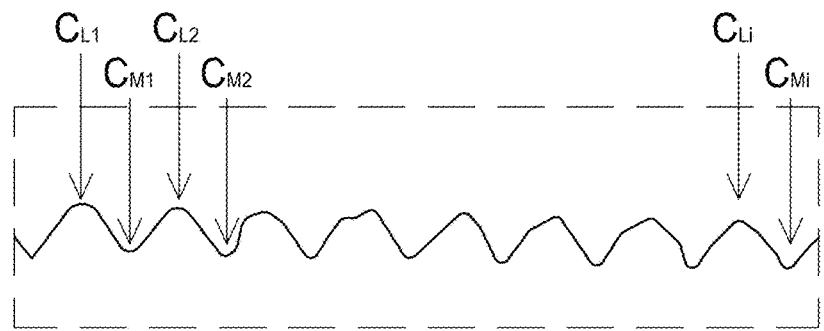
FIG. 5F shows the locally enlarged schematic view of the curve of the carbon concentration shown in FIG. 5E.

FIG. 5F is a locally enlarged schematic view showing the concentration curve of the first dopant (carbon (C)) in the dotted square region in the second region Z2 of FIG. 5E. As shown in FIG. 5F, in the present embodiment, the concentration distribution of the first dopant (carbon (C)) includes at least i local maximums (concentrations $C_{L1}, C_{L2}, \ldots, C_{Li}$ as indicated in the figure) and i local minimums (concentrations $C_{M1}, C_{M2}, \ldots, C_{Mi}$ as indicated in the figure), i denotes a positive integer greater than or equal to 5, such as i=8 in a local region as shown in FIG. 5F. The local maximums and the local minimums appear alternately, and any of the local maximums is greater than any of the local minimums. As shown in the second region Z2 of FIG. 5E, the concentration of the third dopant is less than some of the local maximums and greater than some of the local minimums.

As shown in FIG. 5E, in the first semiconductor layer 500 of the present embodiment, the doping concentration of silicon (Si) is $1\times10^{17}$ cm$^{-3}$ or less and is in the range of about $5\times10^{16}$ cm$^{-3}$ to about $9\times10^{16}$ cm$^{-3}$, the doping concentration of carbon (C) is in the range of about $4\times10^{16}$ cm$^{-3}$ to about $9\times10^{16}$ cm$^{-3}$, and the doping concentration of hydrogen (H) is in the range of about $1\times10^{17}$ cm$^{-3}$ to about $5\times10^{17}$ cm$^{-3}$. On the other hand, in some embodiments, the first zone Z1, the second zone Z2, and the third zone Z3 further contain unavoidable impurities such as oxygen (O) which is not shown for the sake of simplicity. In one embodiment, the oxygen (O) concentrations in the first zone Z1, the second zone Z2, and the third zone Z3 are in the range of $3\times10^{15}$ cm$^{-3}$ to $2\times10^{16}$ cm$^{-3}$, which is close to the detection limit of secondary ion mass spectrometry (SIMS) analysis.

Figure 6:
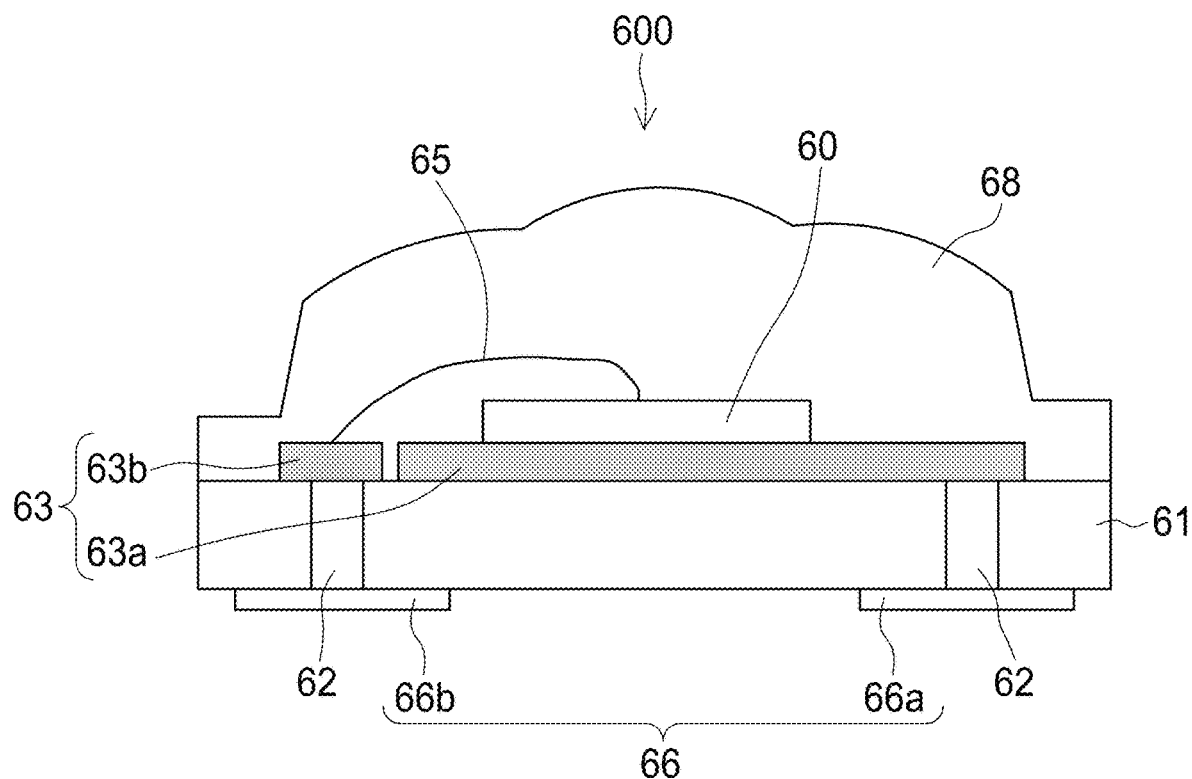
FIG. 6 shows a schematic view of a package structure of a semiconductor device in accordance with one embodiment of the present disclosure.

FIG. 6 is a schematic view showing a package structure of a semiconductor device in accordance with one embodiment of the present disclosure. Referring to FIG. 6, the package structure 600 includes a semiconductor device 60, a package substrate 61, a carrier 63, a bonding wire 65, a contact structure 66, and an encapsulation structure 68. The package substrate 61 may comprise ceramic or glass. The package substrate 61 has a plurality of through-holes 62 therein. The through-holes 62 can be filled with a conductive material such as metal to enhance electrical conduction or/and heat dissipation. The carrier 63 is located on a surface of one side of the package substrate 61, and also contains an electrically conductive material such as metal. The contact structure 66 is on a surface on the other side of the package substrate 61. In the present embodiment, the contact structure 66 includes contact pads 66a and 66b, and the contact pads 66a and 66b can be electrically connected to the carrier 63 through the through-holes 62. In one embodiment, the contact structure 66 may further include a thermal pad (not shown), such as between the contact pad 66a and the contact pad 66b. The semiconductor device 60 is located on the carrier 63 and can be the semiconductor device described in any of the embodiments in the present disclosure. In the present embodiment, the carrier 63 includes a first portion 63a and a second portion 63b, and the semiconductor device 60 is electrically connected to the second portion 63b of the carrier 63 by the bonding wire 65. The material of the bonding wire 65 may include metal, such as gold, silver, copper, aluminum, or an alloy containing at least one of the above elements. The encapsulation structure 68 covers the semiconductor device 60 to protect the semiconductor device 60. Specifically, the encapsulating structure 68 may comprise a resin material such as epoxy, silicone, or the like. The encapsulating structure 68 may further include a plurality of wavelength converting particles (not shown) to convert the first light emitted by the semiconductor device 60 into a second light. The wavelength of the second light is greater than the wavelength of the first light.

The light-emitting device of the present disclosure can be applied to products in the fields of lighting, medical treatment, display, communication, sensing, power supply system, etc., such as lamps, monitors, mobile phones, tablet computers, vehicle dashboards, televisions, computers, wearable devices (such as Watches, bracelets, or necklaces), traffic signs, outdoor displays, or medical equipment.

Based on the above, according to some embodiments of the present disclosure, a semiconductor structure having good surface epitaxial quality can be provided and can be used as a substrate of a semiconductor device so as to benefit for further reducing the production cost of the semiconductor device. According to some embodiments of the present disclosure, a semiconductor device and the manufacturing method thereof are provided to achieve superior technical effects in adjusting the stress generated by the lattice mismatch within a heteroepitaxial structure so as to avoid defects generated at the interface of epitaxial layers.

Although the present invention has been disclosed in the foregoing embodiments, it is not intended to limit the invention, and it is understood by those skilled in the art that the invention can be modified or changed without departing from the spirit and scope of the invention. The scope of the invention is defined by the scope of the appended claims. Furthermore, the foregoing embodiments can be combined or substituted with each other as appropriate, and are not limited to the specific embodiments described. For example, the related parameters of a specific component or the connection relationship between a specific component and other components disclosed in one embodiment may also be applied to other embodiments, and all fall within the scope of the present invention.

What is claimed is:

1. A semiconductor device comprising:
    a first semiconductor layer comprising a first III-V semiconductor material, a first dopant, a second dopant, and a third dopant;
    a second semiconductor layer under the first semiconductor layer and comprising a second III-V semiconductor material and the third dopant;
    a light-emitting structure on the first semiconductor layer and comprising an active structure; and
    a third semiconductor layer between the first semiconductor layer and the light-emitting structure and comprising a third III-V semiconductor material and the third dopant;
    wherein a concentration of the second dopant in the first semiconductor layer is greater than a concentration of the first dopant in the first semiconductor layer, the first dopant is carbon, the second dopant is hydrogen, a concentration of the third dopant in the first semiconductor layer is lower than a concentration of the third dopant in the third semiconductor layer, and a concentration of the third dopant in the second semiconductor layer is greater than the concentration of the third dopant in the first semiconductor layer.

2. The semiconductor device of claim 1, wherein the second semiconductor layer further comprises the first dopant and the second dopant.

3. The semiconductor device of claim 1, wherein the third semiconductor layer further comprises the first dopant and the second dopant.

4. The semiconductor device of claim 2, wherein the first semiconductor layer has a first lattice constant, the second semiconductor layer has a second lattice constant, and the difference between the first lattice constant and the second lattice constant is 2% or more and 10% or less.

5. The semiconductor device of claim 1, wherein the concentration of the third dopant in the third semiconductor layer is lower than the concentration of the third dopant in the second semiconductor layer.

6. The semiconductor device of claim 1, wherein when the semiconductor device is in operation, the active structure emits infrared light.

7. The semiconductor device of claim 1, wherein the first dopant has a concentration curve having a periodically changed pattern.

8. The semiconductor device of claim 7, wherein the concentration curve comprises i local maximums and i local minimums which appear alternately, wherein i denotes a positive integer greater than or equal to 5.

9. The semiconductor device of claim 1, wherein the light-emitting structure does not contain nitrogen (N).

10. The semiconductor device of claim 1, wherein the first III-V semiconductor material and the third III-V semiconductor material are the same.

11. A semiconductor device comprising:
    a first semiconductor layer comprising a first III-V semiconductor material, a first dopant, a second dopant, and a third dopant;
    a second semiconductor layer under the first semiconductor layer and comprising a second III-V semiconductor material, the second dopant and the third dopant; and
    a third semiconductor layer on the first semiconductor layer and comprising a third III-V semiconductor material, the first dopant, the second dopant and the third dopant;
    wherein a concentration of the second dopant in the first semiconductor layer is greater than a concentration of the first dopant in the first semiconductor layer, the first dopant is carbon, the second dopant is hydrogen, a concentration of the first dopant in the third semiconductor layer is lower than the concentration of the first dopant in the first semiconductor layer, and a concentration of the third dopant in the second semiconductor layer is greater than a concentration of the second dopant in the second semiconductor layer.

12. The semiconductor device of claim 11, wherein the first III-V semiconductor material and the third III-V semiconductor material are the same.

13. The semiconductor device of claim 11, wherein the third dopant is silicon.

14. The semiconductor device of claim 7, wherein a concentration of the second dopant in the third semiconductor layer is greater than a concentration of the first dopant in the third semiconductor layer.

15. The semiconductor device of claim 1, wherein the first III-V semiconductor material and the second III-V semiconductor material are different binary III-V semiconductor materials.

* * * * *